US010121722B1

(12) United States Patent
Jha et al.

(10) Patent No.: US 10,121,722 B1
(45) Date of Patent: Nov. 6, 2018

(54) ARCHITECTURE MATERIAL AND PROCESS TO IMPROVE THERMAL PERFORMANCE OF THE EMBEDDED DIE PACKAGE

(71) Applicant: Intel Corporation, Santa Clara, CA (US)

(72) Inventors: Chandra M. Jha, Tempe, AZ (US); Eric J. Li, Chandler, AZ (US); Zhaozhi Li, Chandler, AZ (US); Robert M. Nickerson, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/721,880

(22) Filed: Sep. 30, 2017

(51) Int. Cl.
*H01L 23/34* (2006.01)
*H01L 23/373* (2006.01)
*H01L 23/00* (2006.01)

(52) U.S. Cl.
CPC ............ *H01L 23/373* (2013.01); *H01L 24/01* (2013.01); *H01L 2924/01029* (2013.01); *H01L 2924/01047* (2013.01)

(58) Field of Classification Search
None
See application file for complete search history.

(56) References Cited

U.S. PATENT DOCUMENTS

| 2009/0057918 | A1* | 3/2009 | Kim | H01L 25/0657 |
| | | | | 257/777 |
| 2011/0261550 | A1* | 10/2011 | Wong | H01L 21/561 |
| | | | | 361/818 |
| 2013/0187258 | A1* | 7/2013 | Lu | H01L 23/3135 |
| | | | | 257/621 |
| 2015/0255426 | A1* | 9/2015 | Son | H01L 21/6835 |
| | | | | 257/738 |

* cited by examiner

*Primary Examiner* — Calvin Choi
(74) *Attorney, Agent, or Firm* — Schwabe, Williamson & Wyatt, P.C.

(57) ABSTRACT

A device package and a method of forming the device package are described. The device package has a package layer disposed on a substrate. The package layer includes a mold layer surrounding solder balls and a die. The device package also has a trench disposed in the mold layer to surround the die of the package layer. The device package further includes a conductive layer disposed on a top surface of the die. The conductive layer is disposed over the top surface of the die and in the trench of the package layer. The trench may have a specified distance between the die edges, and a specified width and a specified depth based on the conductive layer. The device package may include an interposer with solder balls disposed on the conductive layer and above the package layer, and an underfill layer disposed between the interposer and the package layer.

25 Claims, 6 Drawing Sheets

ARCHITECTURE MATERIAL AND PROCESS TO IMPROVE THERMAL PERFORMANCE OF THE EMBEDDED DIE PACKAGE

FIELD

Embodiments relate to semiconductor devices. More particularly, the embodiments relate to packaging semiconductor devices with an embedded die package that includes a conductive layer and a trench to improve the thermal performance of the embedded die package.

BACKGROUND

Packaging semiconductor devices present several problems. One such problem is encountered when using an interposer-silicon-substrate architecture such as an embedded package that is widely used in mobile applications. In this architecture, after a system on chip (SOC) is attached to the substrate, an interposer is attached to the substrate through a package on package (PoP) interconnect and then mechanically coupled to the bottom package with a molding compound or epoxy materials.

The interposer-silicon-substrate architecture is typically implemented as a result of (i) the flexibility of using the interposer to translate the fine PoP pitch, custom pattern on the substrate to standard pitch, and pattern on top of the interposer to accommodate standard and off-the-shelf memory packages; and (ii) the symmetrical mechanical configuration of this architecture (i.e., an organic substrate-silicon-organic substrate) to control the overall package warpage for standard surface mount processes.

This architecture, however, also has some major disadvantages. One major disadvantage of the interposer-silicon-substrate architecture is the thermal performance as the SOC die is embedded in the molding or epoxy compound underneath the organic interposer. For example, the thermal conduction through the interposer can be improved by adding thermal vias and/or reducing the layer count. Nonetheless, the thermal conductivity of typical molding or epoxy compounds still remain very low (e.g., <1 W/mK), including a high-K molding or epoxy materials that have at best a thermal conductivity of roughly 2 W/mK. As such, this major disadvantage of the interposer-silicon-substrate architecture elicits the bottleneck for the thermal performance of the SOC and thus produces overheating issues.

Accordingly, there is a need to form an improved embedded die package with improved thermal performance without scaling down the performance of the SOC.

BRIEF DESCRIPTION OF THE DRAWINGS

Embodiments described herein are illustrated by way of example and not limitation in the figures of the accompanying drawings, in which like references indicate similar features. Furthermore, some conventional details have been omitted so as not to obscure from the inventive concepts described herein.

DETAILED DESCRIPTION

Figure 1:
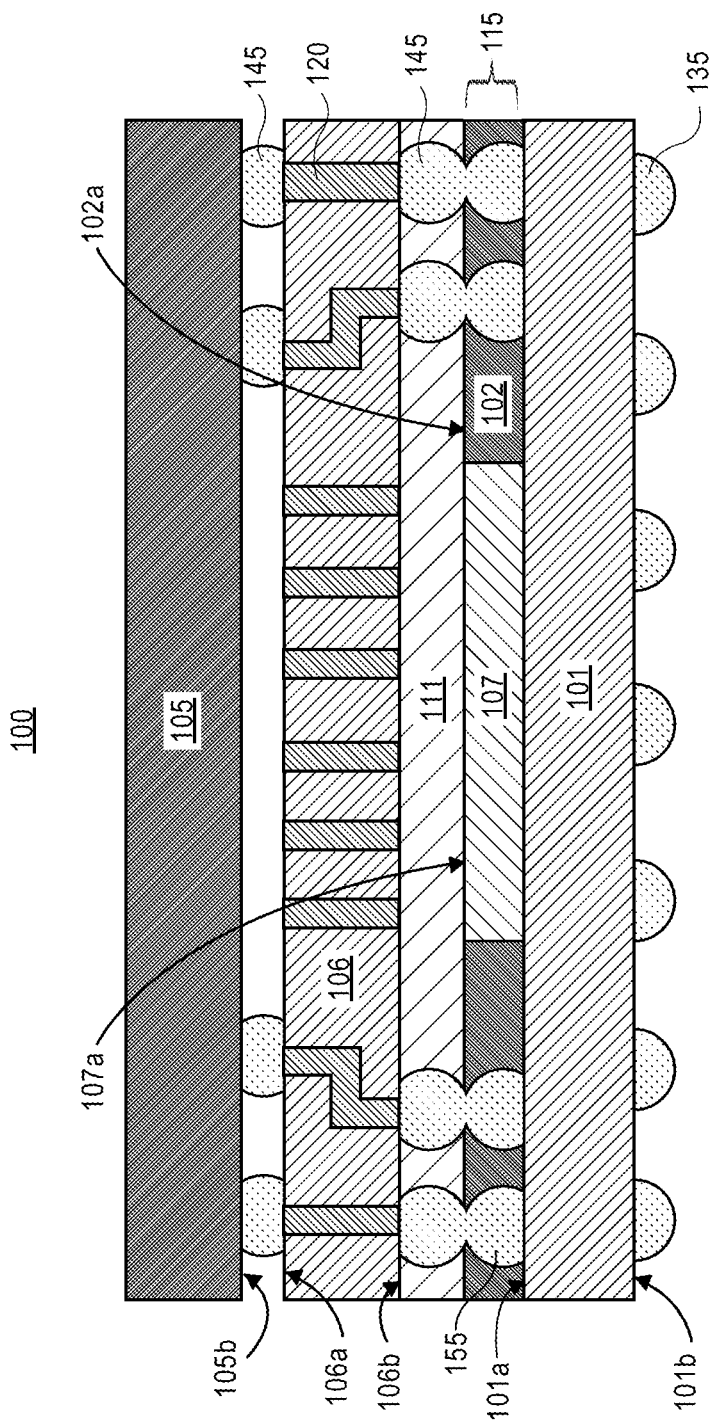
FIG. 1 is a cross-sectional view of a semiconductor package having a memory, an interposer, an underfill layer, a package layer, and a substrate, according to one embodiment.

Described below are ways for forming semiconductor devices (or packages) with an embedded die package that includes a conductive layer (or a conductive paste material) and a trench to improve the thermal performance of the embedded die package. Specifically, the semiconductor packages described herein include the conductive layer which may replace a molding compound or a capillary underfill (CUF) material above the system on chip (SOC) and under the interposer. For some embodiments, the thermal conductivity of the conductive layer may be considerably higher than a high-K mold or CUF materials and may improve the thermal performance of the package significantly. In addition, since the conductive layer may also be electrically conductive, described herein is a novel package architecture and process flow for a semiconductor package that prevents the conductive layer from flowing into the package on package (PoP) region to avoid leakage failures.

In the following description, various aspects of the illustrative implementations will be described using terms commonly employed by those skilled in the art to convey the substance of their work to others skilled in the art. However, it will be apparent to those skilled in the art that the present embodiments may be practiced with only some of the described aspects. For purposes of explanation, specific numbers, materials and configurations are set forth in order to provide a thorough understanding of the illustrative implementations. However, it will be apparent to one skilled in the art that the present embodiments may be practiced without the specific details. In other instances, well-known features are omitted or simplified in order not to obscure the illustrative implementations.

Various operations will be described as multiple discrete operations, in turn, in a manner that is most helpful in understanding the present embodiments, however, the order of description should not be construed to imply that these operations are necessarily order dependent. In particular, these operations need not be performed in the order of presentation.

The present embodiments may include a semiconductor package having a memory, an interposer, an underfill layer, a conductive layer, a package layer with a trench, and a substrate to enhance packaging solutions. For example, as described herein, the present embodiments enable a novel architecture material (e.g., optimized conductive paste materials) and process to improve thermal performance of an embedded die package. According to some embodiments described herein, the semiconductor packages (also referred to as device packages) improve packaging solutions by providing (i) an improved thermal performance of the package while maintaining each of the advantages of the interposer-silicon-substrate architecture (such as pitch translation and warpage control); (ii) a reduction of the thermal resistance between the die junction to the top of the interposer (Rj-int) (e.g., the Rj-int may be reduced by roughly three times (>3×)) (also note that the interposer may have a high Cu-content with no solder resist layers at the top and bottom surfaces interfacing die); (iii) an improved class test thermal response; and (iv) an improved architecture for the embedded package that resolves the known thermal issues (typically involved with interposer-silicon-substrate embedded die package architecture)—without having to scale down the performance of the package—while maintaining all the key benefits in warpage control and PoP pitch translation.

FIG. 1 is a cross-sectional view of a semiconductor package 100 having a memory 105, an interposer 106, an underfill layer 111, a package layer 115, and a substrate 101, according to one embodiment. The semiconductor package 100 has the package layer 115 disposed on a top surface 101a of the substrate 101. The package layer 115 may have a SOC which may include a die 107, a molding layer 102, and top side ball attach (TSBA) 155 (also referred to as TSBA balls). For one example, after the TSBA, die attach, and exposed die molding are formed in the package layer 115, a through mold interconnect (TMI) process is used to open up the top side of TSBA 115 for PoP solder joint. For this example, a spray or a dipping process may be used to apply flux onto the PoP area. In addition, the interposer 106 with PoP solder balls 145 on the bottom side (shown with a pitch translation routing in the PoP area and thermal vias 120 in the die area) is then picked and placed (PnP) onto the package layer 115 followed by reflow or attached using a thermal compression bonding (TCB) process (which is typically required for PoP pitch with less than 350 um).

After deflux, a CUF process is typically used to apply the underfill layer 111 (or materials) between a bottom surface 106b of the interposer 106 and top surface 102a and 107a of the package layer 107 to couple them together. Thereafter, the substrate 101 has a bottom side ball attach (BSBA) balls 135 coupled to a bottom surface 101b of the substrate, where a BSBA process is performed and the unit is singulated to complete the assembly. Continuing with the above example, the semiconductor package 100 may be PnP onto a motherboard (not shown) and then followed by PnP of the memory 105 (or memory package) above the interposer 106 using solder balls 145 to electrically couple a bottom surface 105b of the memory 105 and a top surface 106a of the interposer 106. This coupling of the memory 105 and the interposer 106 may be accomplished with both a flux dipping process and a reflow that is performed to form all necessary solder joints 145 simultaneously.

Note that the semiconductor package 100 may be assembled with one or more variations including (i) replacing the CUF process with an exposed interposer molding process or (ii) replacing the CUF material by epoxy flux material so that post interposer TCB the package is ready for BSBA. Also note, however, that in this example (and most, if not all, examples) of the semiconductor package 100, the thermal conductivity of the CUF/molding/epoxy flux materials prompts the bottom neck problem(s) (as described above) that decrease the thermal performance of this semiconductor package 100.

FIGS. 2-5 illustrate a semiconductor package having an embedded die package that includes a conductive layer and a trench to improve the thermal performance of the package.

FIGS. 2A-2D illustrate a process flow 200 of forming a semiconductor package having a memory, an interposer, an underfill layer, a conductive layer, a package layer with a trench, and a substrate, according to one embodiment.

Figure 2A:
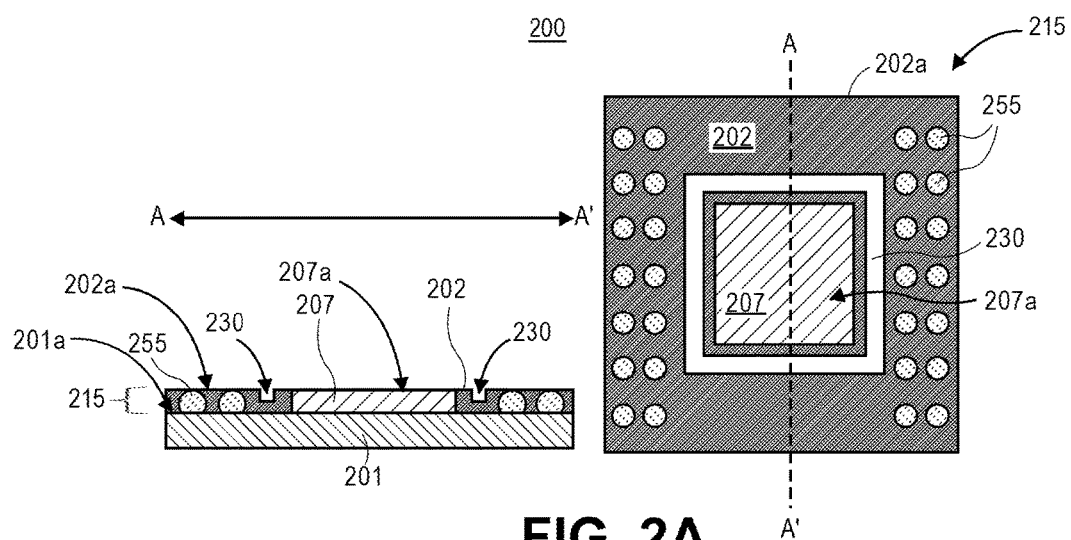
FIG. 2A is a cross-sectional view and a corresponding plan view of a trench patterned on a mold layer in a package layer and the package layer disposed on a substrate, according to one embodiment.
Figure 2B:
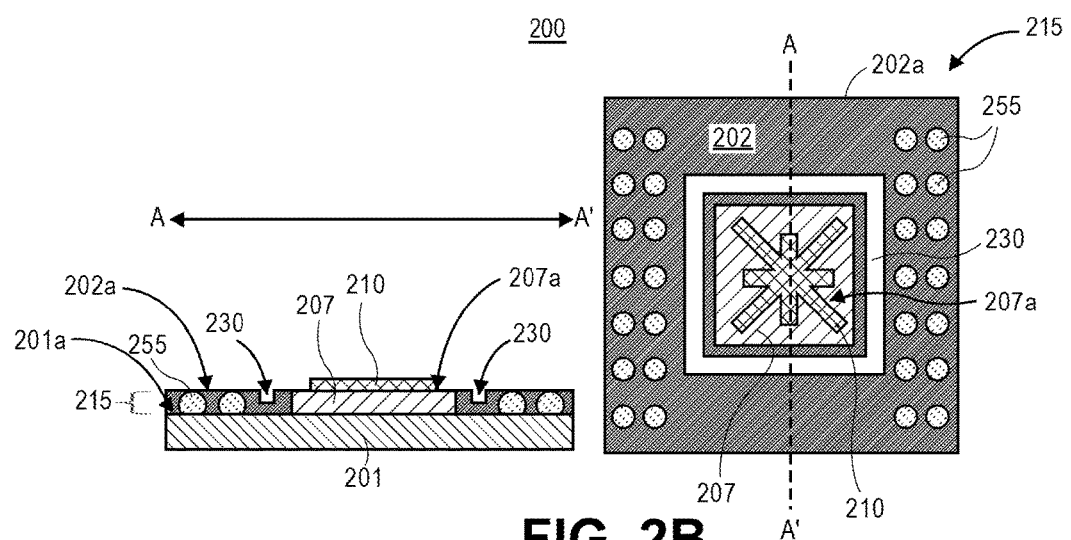
FIG. 2B is a cross-sectional view and a corresponding plan view of a conductive layer disposed over a die in the package layer, according to one embodiment.
Figure 2C:
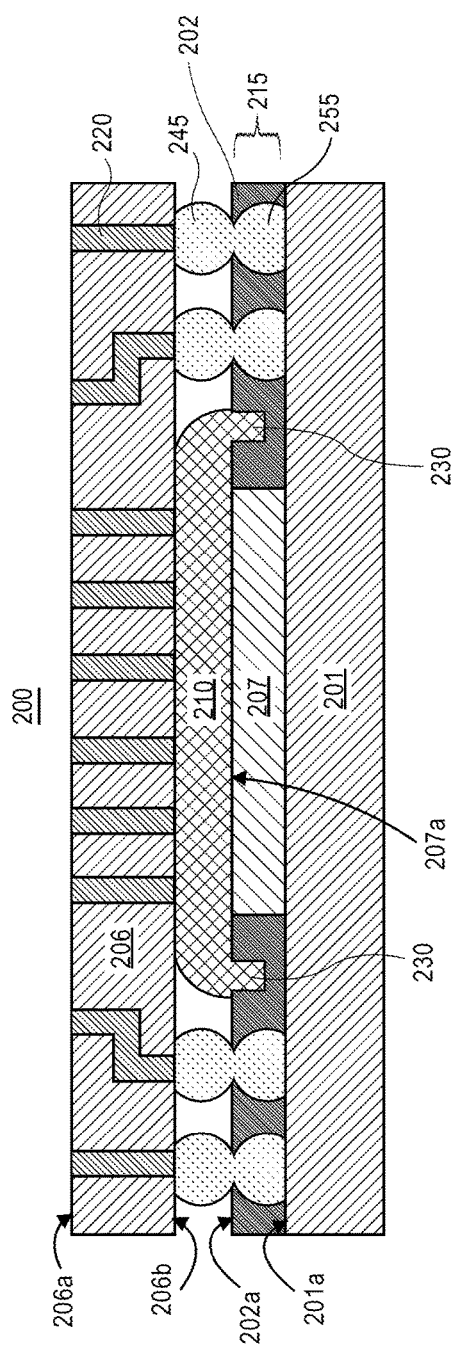
FIG. 2C is a cross-sectional view of an interposer disposed on the package layer, according to one embodiment.
Figure 2D:
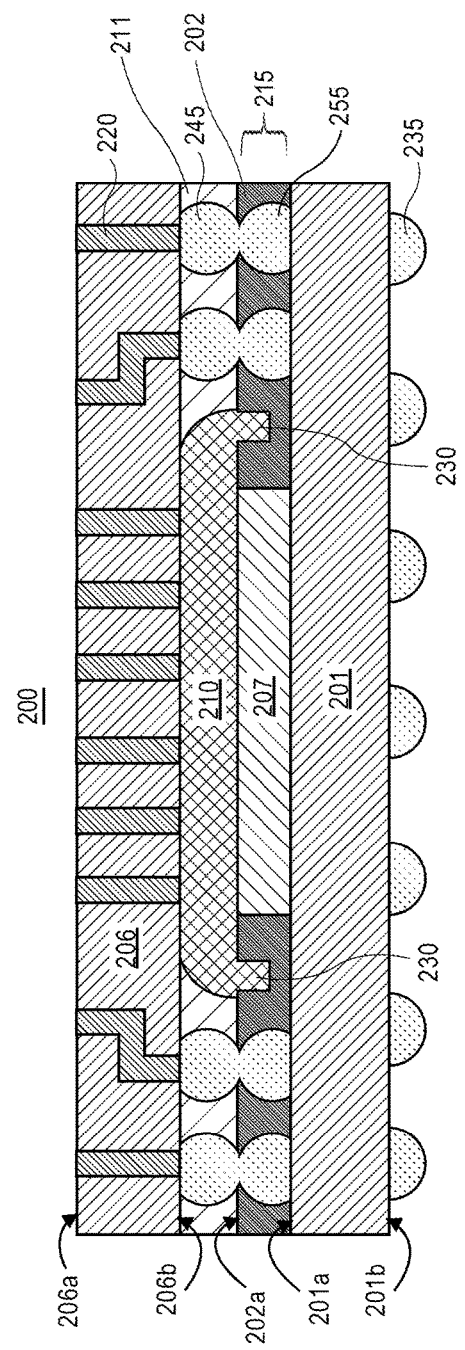
FIG. 2D is a cross-sectional view of an underfill layer disposed between the interposer and the package layer, according to one embodiment.

Note that the semiconductor package formed by process flow 200 may be similar to the semiconductor package 100 of FIG. 1, however the semiconductor package of process flow 200 includes a conductive layer 210 (as shown in FIGS. 2B-2D) disposed on a top surface 207a of a die 207 (as shown in FIGS. 2A-2D) and then compressed (or formed) into a trench 230 that is formed in a mold layer 202 of a package layer 215 (as shown in FIGS. 2C-2D), as such the conductive layer 210 may replace portions of a mold compound (e.g., mold layer 102 of FIG. 1) and/or an underfill material (or CUF) (e.g., CUF 111 of FIG. 1) between a SOC (e.g., package layer 115 of FIG. 1) and an interposer (e.g., interposer 106 of FIG. 1).

Referring now to FIG. 2A, a cross-sectional view and a corresponding plan view of a package layer 215 disposed on a top surface 201a of a substrate 201 is illustrated, according to one embodiment. For embodiment, the package layer 215 may be electrically coupled to the substrate 201 with a TMI process.

The package layer 215 (also referred to as a SOC) may include a die 207, a mold layer 202, and TSBA balls 255. For one embodiment, the package layer 215 has an exposed top surface 202a of the mold layer 202 (also referred to as an exposed die mold) that surrounds the die 207 and the TSBA balls 255. For some embodiments, a trench 230 (or a laser trench) may be patterned on the top surface 202a of the mold layer 202 in the package layer 215. For example, the trench 230 may be formed on the mold layer 202 with a laser drilling process (or with the TMI process described above), as the trench 230 forms a cavity enclosure surrounding the die 207 (note that a portion/region of the mold layer is maintained between the die 207 and the trench 230). In addition, the package layer 215 includes a top surface 207a of the die 207.

For some embodiments, after each of the TSB balls 255, the die 207 attach, and the mold layer 202 are formed on the package layer 215, the TMI process may be used to open up the top surface 202a of the TSBA 255 to form the PoP solder joints as well as to dispose (or create) the trench 230 around each of the four sides of the die 207 (as shown in the plan view of FIG. 2A). For one embodiment, the width of the trench 230 may be in the order of 100 um, and the depth of the trench 230 may be in the order of 50 um. Note that, since the distance between the edges of the die 207 and the PoP area is limited by routing design (e.g., usually an area of 300 um or more), the package layer 215 still maintains enough available space to fit the trench 230 around the die 207. Also note that in FIG. 2A only a two-sided PoP design is shown, but the embodiments described above may be implemented for a four-sided design as well.

For other embodiments, the semiconductor package, as shown in FIG. 2A, may include fewer or additional packaging components based on the desired packaging design.

Referring now to FIG. 2B, a cross-sectional view and a corresponding plan view of a conductive layer 210 disposed over the top surface 207a of the die 207 of the package layer 215 is illustrated, according to one embodiment. For one embodiment, the conductive paste 210 includes one or more different conductive paste materials, including metallic particles such as copper (Cu), silver (Ag), Ag coated with Cu, etc., which can be optimized to have a higher thermal conductivity.

According to some embodiments, the conductive layer 210 is disposed directly on the exposed top surface 207a of the die 207 without an intervening adhesive layer. For example, as shown in the plan view of FIG. 2B, the conductive layer 210 may be disposed with a crossing pattern (as shown) or any other dispense patterns that may ensure a uniform coverage on the top surface 207a of the die 207.

For example, thermal conductivity of molding and CUF materials can only be improved slightly to be roughly 2 W/mK, as limited by the type of fillers (e.g., sapphire particles) used to ensure an electrical insulating behavior, which is not a significant improvement over typical molding and CUF materials. Alternatively, the semiconductor package of process flow 200 utilizes the conductive layer 210 which includes one or more different conductive paste materials. For example, the conductive layer 210 may be selected from the one or more different conductive paste materials to be optimized for thermal purposes and improvement of overall thermal conductivity. For one embodiment, the conductive layer 210 can be optimized to have a thermal conductivity of roughly (~) 40 W/mK.

Moreover, the conductive layer 210 has an epoxy component (or material) in the one or more paste materials used to ensure that the conductive layer 210 has similar mechanical coupling capabilities (e.g., as other molding and CUF materials) to maintain and/or improve the warpage control/mitigation. Note that the process flow 200 may reformulate the one or more conductive paste materials of the conductive layer 210 to optimize and achieve the balance of high thermal conductivity and necessary mechanical properties that is needed for the semiconductor package.

The conductive layer 210 may have a high thermal conductivity (which may create a heightened electrically conductivity), therefore the package layer 215 uses the trench 230 formed around the die 207 to enable the spatial separation of the conductive layer 210 application area from the electrically active PoP region, according to some embodiments. These embodiments help to resolve the major bottleneck problem encountered with the typical embedded die package architecture, while also maintaining all the important benefits in warpage control and PoP pitch translation.

Note that the semiconductor package, as shown in FIG. 2B, may include fewer or additional packaging components based on the desired packaging design.

Referring now to FIG. 2C, a cross-sectional view of an interposer 206 disposed on/above the package layer 215 is illustrated, according to one embodiment. As shown in FIG. 2C, the process flow 200 illustrates the attachment of the interposer 206 to form PoP solder ball 245 joints with the package layer 215 and the spreading/compressing out of the conductive layer 210 to cover the top surface 207a of the die 207. Note that, after electrically coupling the interposer 206 with the package layer 215, the compressed conductive layer 210 (or the excess of the conductive layer 210) is spread out over the top surface 207a of the die 207 and in trench 230 that surrounds the die 207, where the trench 230 holds the excess conductive layer 210 instead of flowing into the PoP area.

For one embodiment, the interposer 206 has a top surface 206a and a bottom surface 206b that is attached to the package layer 215 using a TCB process. For example, a flux dipping may be implemented in this embodiment as the existence of the dispensed conductive layer 210 may interfere with the flux spray process. The curing or sintering time of the conductive layer 210 may take longer than a typical TCB bonding time. As such, during the process of disposing the interposer 206 to the package layer 215 shown in FIG. 2C, the viscosity of the conductive layer 210 may remain low enough not to interfere with the TCB bonding and even retracting process. In addition, during the TCB bonding process, the conductive layer 210 may be compressed (or pushed down) by the interposer 206 and spread out in all direction as the conductive layer 210 flows into the trench 230 formed around the die 207 and trapped in the trench 230 to avoid flow towards the PoP area (i.e., preventing leakage failures). For some embodiments, the width and depth of the trench 230 and the amount of dispensed conductive layer 210 can be optimized to prevent the conductive layer 210 overflowing the trench 230 and to cover the entire top surface 207a of the die.

Note that the semiconductor package, as shown in FIG. 2C, may include fewer or additional packaging components based on the desired packaging design.

Referring now to FIG. 2D, a cross-sectional view of an underfill layer 211 disposed between the bottom surface 206b of the interposer 206 and the exposed top surface 202a of the package layer 215, according to one embodiment. As shown in FIG. 2D, the process flow 200 illustrated the underfill layer 211 filling the gap in the PoP area between the interposer 206, the package layer 215, and the solder balls 245.

For one embodiment, the underfill layer 211 may be a CUF. The underfill layer 211 may be disposed to fill the gap between the bottom surface 206b of the interposer 206 and the top surface 202a of the package layer in the PoP area to protect the solder joints 245. Thereafter, the process flow 200 attaches/disposes the BSBA balls 235 on a bottom surface 201b of the substrate 201 to finish the assembly process. Accordingly, as shown in FIG. 2D, the semiconductor package is now assembled with thermally (and electrically) conductive coupling between the die 207 and the interposer 206, while having insulating protection around the PoP area above the package layer 215.

Note that the semiconductor package, as shown in FIG. 2D, may include one or more variations and/or fewer or additional packaging components based on the desired packaging design. For example, an epoxy flux material can be used to fill the PoP area between the interposer 206 and the package layer 215 instead of using a CUF. In another example, an interposer (e.g., interposer 206) can be replaced by a memory package to further reduce the total z-height of the semiconductor package. Note, however, that any of these variations implement the similar process flow as illustrated above in FIGS. 2A-2D, which enable a highly thermally (and thus electrically) conductive material between the die and the top package and insulating material in the PoP area.

Figure 3:
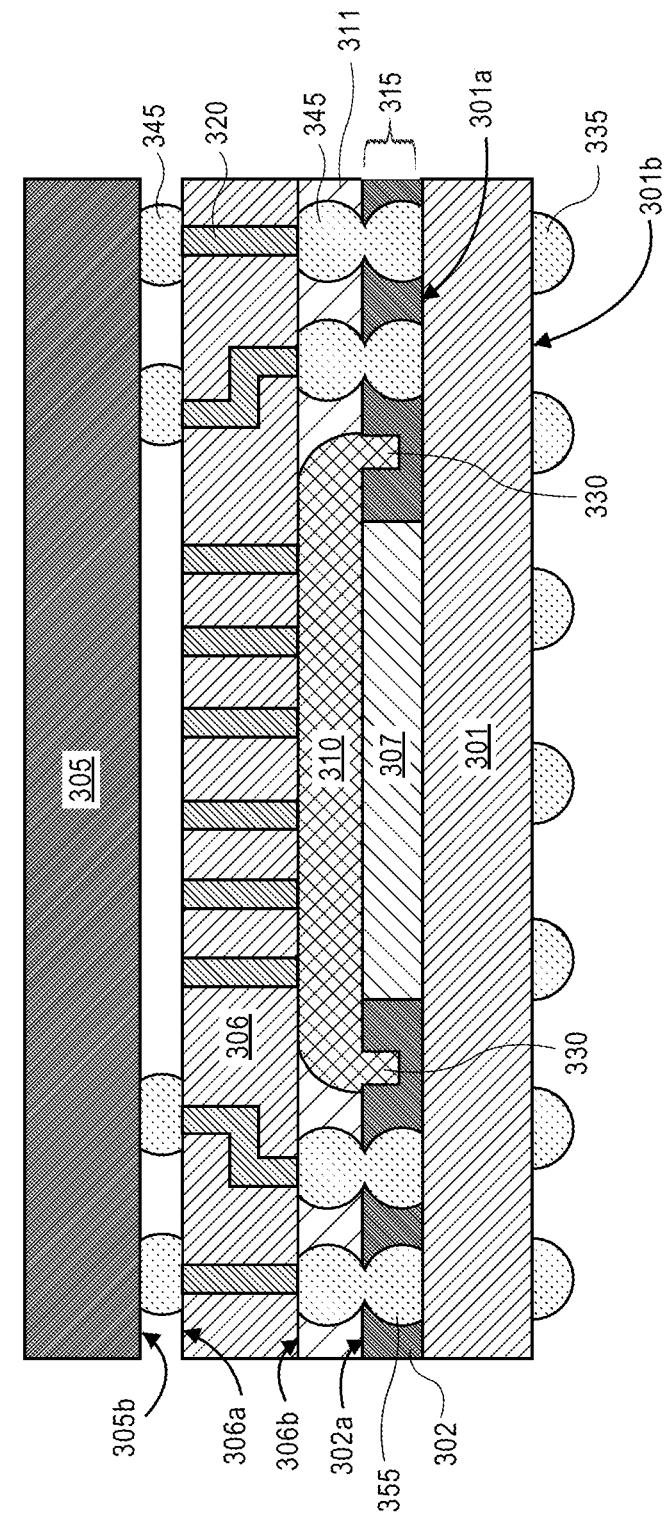
FIG. 3 is a cross-sectional view of a semiconductor package having a memory, an interposer, an underfill layer, a conductive layer, a package layer with a trench, and a substrate, according to one embodiment.

FIG. 3 is a cross-sectional view of a semiconductor package 300 having a memory 305, an interposer 306, an underfill layer 311, a conductive layer 310, a package layer 315 with a trench 330, and a substrate 301, according to one embodiment. Note that the semiconductor package 300 of FIG. 3 is similar to the semiconductor package formed by the process flow 200 of FIGS. 2A-2D.

For some embodiments, the semiconductor package 300 has a package layer 315 disposed on a top surface 301a of the substrate 301. The package layer 315 may include a mold layer 302 surrounding a first plurality of solder balls 355 and a die 307. For one embodiment, the semiconductor package 300 has the trench 330 disposed on a top surface 302a of the mold layer 302 to surround the die 307 of the package layer 315. For one embodiment, the semiconductor package 300 also has the conductive layer 310 disposed on a top surface 307a of the die 307. The conductive layer 310 may be disposed over the top surface 307a of the die 307 and in (or spread/pressed into) the trench 330 of the package layer 315.

For additional embodiments, the semiconductor package 300 may further include the interposer 306 with a second plurality of solder balls 345 disposed on the conductive layer 310 and above the top surface 302a of the package layer 315. Accordingly, the semiconductor package 300 may further include the underfill layer 311 disposed between a bottom surface 306b of the interposer 306 and the top surface 302a of the package layer 315. For one embodiment, the semiconductor package 300 may also include the memory 305 (or any other package) with a third plurality of solder balls 345 disposed on a top surface 306a of the interposer 306, where the third solder balls 345 electrically couple the memory 305, the interposer 306, and one or more vias 320 of the interposer 306. For an additional embodiment, the semiconductor package 300 may have a fourth plurality of solder balls 335 disposed on a bottom surface 301a of the substrate 301 to electrically couple the package 300 to another electrical component, such as a motherboard.

For one embodiment, the underfill layer 311 may include solder balls (or bumps) 345 that connect pads (not shown) on the bottom surface 306b of the interposer 306 and the package layer 315. For example, the underfill layer 311 may be used on a ball grid array (BGA), a pin grid array (PGA), a land grid array (LGA), or any other connectivity packaging. For one embodiment, the underfill layer 311 may include controlled collapse chip connection (C4) bumps that connect pads (not shown) on the bottom surface 306b of the interposer 306 and the package layer 315. For one embodiment, the die 307 includes, but is not limited to, a semiconductor die, an integrated circuit, a CPU, a microprocessor, a platform controller hub (PCH), a memory, and a field programmable gate array (FPGA).

For one embodiment, the substrate 301 may include, but is not limited to, a package, a motherboard, and a printed circuit board (PCB). For one embodiment, the substrate 301 is a PCB. For one embodiment, the PCB is made of an FR-4 glass epoxy base with thin copper foil laminated on both sides (not shown). For certain embodiments, a multilayer PCB can be used, with pre-preg and copper foil (not shown) used to make additional layers. For example, the multilayer PCB may include one or more dielectric layers, where each dielectric layer can be a photosensitive dielectric layer (not shown). For some embodiments, holes (not shown) may be drilled in the substrate 301. For one embodiment, the substrate 301 may also include conductive copper traces, metallic pads, and holes (not shown).

Alternatively, note that a semiconductor package (e.g., the semiconductor package 300) may include a memory (e.g., memory 305) disposed directly above a conductive layer (e.g., conductive layer 310) and above a package layer (e.g., package layer 315) (i.e., this memory may replace (and/or bypass) the interposer to reduce the z-height of the package).

Note that the semiconductor package 300 may include fewer or additional packaging components based on the desired packaging design.

Figure 4:
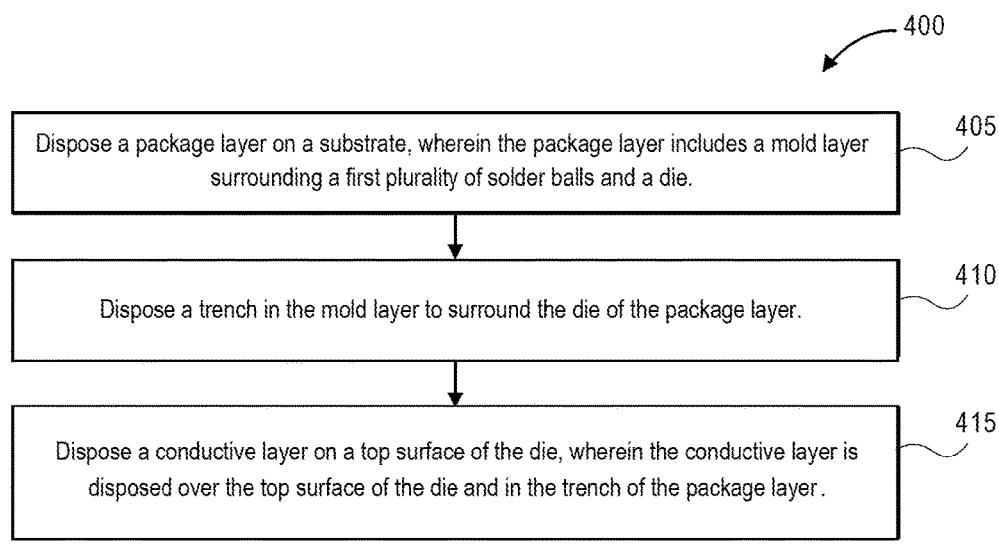
FIG. 4 is a process flow illustrating a method of forming a semiconductor package having a memory, an interposer, an underfill layer, a conductive layer, a package layer with a trench, and a substrate, according to one embodiment.

FIG. 4 is a process flow illustrating a method of forming a semiconductor package having a memory, an interposer, an underfill layer, a conductive layer, a package layer with a trench, and a substrate, according to one embodiment. FIG. 4 is a process flow 400 illustrating a method of forming a semiconductor package a memory, an interposer, an underfill layer, a conductive layer, a package layer with a trench, and a substrate, according to one embodiment. Process flow 400 illustrates a method of forming the semiconductor package. For example, process flow 400 shows a method of forming a semiconductor package as shown in FIGS. 2-3.

At block 405, the process flow 400 disposes a package layer on a substrate, wherein the package layer includes a mold layer surrounding a first plurality of solder balls and a die (as shown in FIGS. 2-3). At block 410, the process flow 400 disposes a trench in the mold layer to surround the die of the package layer (as shown in FIGS. 2-3). At block 415, the process flow 400 disposes a conductive layer on a top surface of the die, wherein the conductive layer is disposed over the top surface of the die and in the trench of the package layer (as shown in FIGS. 2-3).

For one embodiment, the process flow may include a specified distance between each of the edges of the die and the trench. For another embodiment, the process flow may include the trench having a specified width and a specified depth based on the conductive layer (e.g., based on the spreading out area covered by the conductive layer). For one embodiment, the process may further include dispose an interposer with a second plurality of solder balls on the conductive layer and above the package layer. In addition, the process may also dispose an underfill layer between a bottom surface of the interposer and a top surface of the package layer.

For other embodiments, the process may dispose a memory with a third plurality of solder balls on the interposer, wherein the third solder balls electrically couple the memory and the interposer. For another embodiment, the process flow may dispose a fourth plurality of solder balls on a bottom surface of the substrate. For example, the process flow may dispose the substrate on a motherboard, wherein the fourth plurality of solder balls electrically couple the substrate and the motherboard.

For an alternative embodiment, the process flow may dispose a second memory with a fifth plurality of solder balls on the conductive layer and above the package layer (i.e., the second memory may replace the interposer to reduce the z-height of the package). For some embodiments, the conductive layer may include one or more different materials, and the conductive layer may be disposed on the top surface of the die with one or more different patterns. For another embodiment, the process flow may have the substrate which is a printed circuit board.

Note that the semiconductor package formed by process flow 400 may include fewer or additional packaging components based on the desired packaging design.

Figure 5:
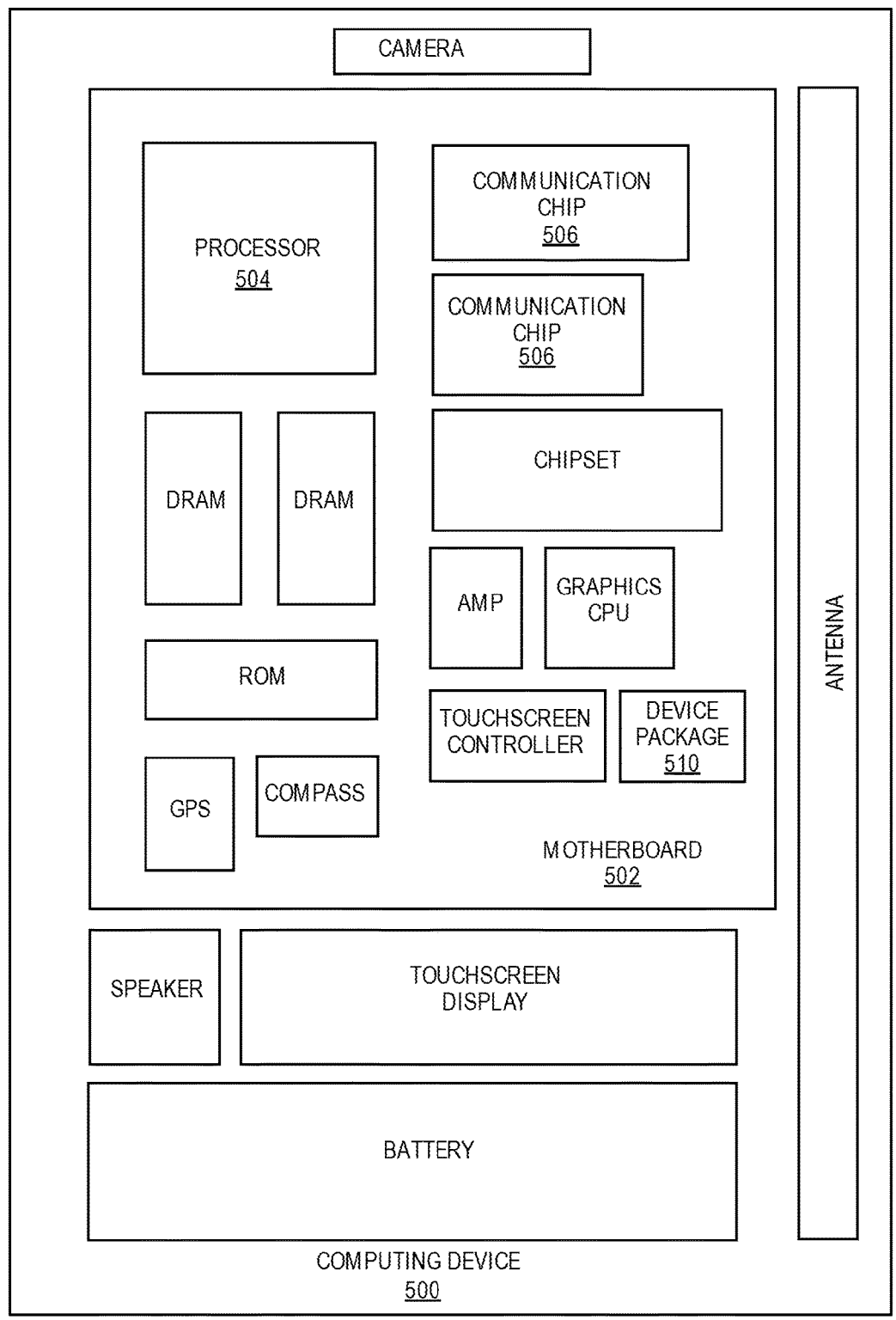
FIG. 5 is a schematic block diagram illustrating a computer system that utilizes a device package with a memory, an interposer, an underfill layer, a conductive layer, a package layer with a trench, and a substrate, according to one embodiment.

FIG. 5 is a schematic block diagram illustrating a computer system that utilizes a device package with a memory, an interposer, an underfill layer, a conductive layer, a package layer with a trench, and a substrate, as described herein. FIG. 5 illustrates an example of computing device 500. Computing device 500 houses motherboard 502. Motherboard 502 may include a number of components, including but not limited to processor 504, device package 510, and at least one communication chip 506. Processor 504 is physically and electrically coupled to motherboard 502. For some embodiments, at least one communication chip 506 is also physically and electrically coupled to motherboard 502. For other embodiments, at least one communication chip 506 is part of processor 504.

Depending on its applications, computing device 500 may include other components that may or may not be physically and electrically coupled to motherboard 502. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

At least one communication chip 506 enables wireless communications for the transfer of data to and from computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. At least one communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

Processor 504 of computing device 500 includes an integrated circuit die packaged within processor 504. Device package 510 may be, but is not limited to, a packaging substrate and/or a printed circuit board. Device package 510 may a memory, an interposer, an underfill layer, a conductive layer, a package layer with a trench, and a substrate (as illustrated in FIGS. 2-4) of the computing device 500. Further, the device package 510 an embedded die package having a conductive layer and a trench to improve the thermal performance of the embedded die package.

Note that device package 510 may be a single component, a subset of components, and/or an entire system, which may be limited to device package 510 and/or any other component that requires the embodiments described herein of the device package 510.

For some embodiments, the integrated circuit die may be packaged with one or more devices on device package 510 that include a thermally stable RFIC and antenna for use with wireless communications. The term "processor" may refer to any device or portion of a device that processes electronic data from registers and/or memory to transform that electronic data into other electronic data that may be stored in registers and/or memory.

At least one communication chip 506 also includes an integrated circuit die packaged within the communication chip 506. For some embodiments, the integrated circuit die of the communication chip may be packaged with one or more devices on the device package 510, as described herein.

The following examples pertain to further embodiments. The various features of the different embodiments may be variously combined with some features included and others excluded to suit a variety of different applications.

The following examples pertain to further embodiments:

Example 1 is a device package, comprising of a package layer disposed on a substrate. The package layer includes a mold layer surrounding a first plurality of solder balls and a die; a trench disposed in the mold layer to surround the die of the package layer; and a conductive layer disposed on a top surface of the die. The conductive layer is disposed over the top surface of the die and in the trench of the package layer.

In example 2, the subject matter of example 1 can optionally include the trench having a specified distance between each of the edges of the die.

In example 3, the subject matter of any of examples 1-2 can optionally include the trench having a specified width and a specified depth based on the conductive layer.

In example 4, the subject matter of any of examples 1-3 can optionally include an interposer with a second plurality of solder balls disposed on the conductive layer and above the package layer; and an underfill layer disposed between a bottom surface of the interposer and a top surface of the package layer.

In example 5, the subject matter of any of examples 1-4 can optionally include a memory with a third plurality of solder balls disposed on the interposer. The third solder balls electrically couple the memory and the interposer; and a fourth plurality of solder balls disposed on a bottom surface of the substrate.

In example 6, the subject matter of any of examples 1-5 can optionally include the substrate disposed on a motherboard. The fourth plurality of solder balls electrically couple the substrate and the motherboard.

In example 7, the subject matter of any of examples 1-6 can optionally include a second memory with a fifth plurality of solder balls disposed on the conductive layer and above the package layer.

In example 8, the subject matter of any of examples 1-7 can optionally include the conductive layer which includes one or more different materials. The conductive layer is disposed on the top surface of the die with one or more different patterns.

In example 9, the subject matter of any of examples 1-8 can optionally include the substrate is a printed circuit board.

Example 10 is a method of forming a device package, comprising of disposing a package layer on a substrate. The package layer includes a mold layer surrounding a first plurality of solder balls and a die; disposing a trench in the mold layer to surround the die of the package layer; and disposing a conductive layer on a top surface of the die. The conductive layer is disposed over the top surface of the die and in the trench of the package layer.

In example 11, the subject matter of example 10 can optionally include the trench having a specified distance between each of the edges of the die.

In example 12, the subject matter of any of examples 10-11 can optionally include the trench having a specified width and a specified depth based on the conductive layer.

In example 13, the subject matter of any of examples 10-12 can optionally include disposing an interposer with a second plurality of solder balls on the conductive layer and above the package layer; and disposing an underfill layer between a bottom surface of the interposer and a top surface of the package layer.

In example 14, the subject matter of any of examples 10-13 can optionally include disposing a memory with a third plurality of solder balls on the interposer. The third solder balls electrically couple the memory and the interposer; and disposing a fourth plurality of solder balls on a bottom surface of the substrate.

In example 15, the subject matter of any of examples 10-14 can optionally include the substrate is disposed on a motherboard. The fourth plurality of solder balls electrically couple the substrate and the motherboard.

In example 16, the subject matter of any of examples 10-15 can optionally include disposing a second memory with a fifth plurality of solder balls on the conductive layer and above the package layer.

In example 17, the subject matter of any of examples 10-16 can optionally include the conductive layer which includes one or more different materials. The conductive layer is disposed on the top surface of the die with one or more different patterns.

In example 18, the subject matter of any of examples 10-17 can optionally include the substrate is a printed circuit board.

Example 19 is a device package comprising of a package layer disposed on a substrate, wherein the package layer includes a mold layer surrounding a first plurality of solder balls and a die; a trench disposed in the mold layer to surround the die of the package layer; a conductive layer disposed on a top surface of the die. The conductive layer is disposed over the top surface of the die and in the trench of the package layer; an interposer with a second plurality of solder balls disposed on the conductive layer and above the package layer; an underfill layer disposed between a bottom surface of the interposer and a top surface of the package layer; and a memory with a third plurality of solder balls disposed on the interposer. The third solder balls electrically couple the memory and the interposer, and wherein a fourth plurality of solder balls are disposed on a bottom surface of the substrate.

In example 20, the subject matter of example 19 can optionally include the trench having a specified distance between each of the edges of the die.

In example 21, the subject matter of any of examples 19-20 can optionally include the trench having a specified width and a specified depth based on the conductive layer.

In example 22, the subject matter of any of examples 19-21 can optionally include the substrate disposed on a motherboard. The fourth plurality of solder balls electrically couple the substrate and the motherboard.

In example 23, the subject matter of any of examples 19-22 can optionally include the conductive layer which includes one or more different materials.

In example 24, the subject matter of any of examples 19-23 can optionally include the conductive layer disposed on the top surface of the die with one or more different patterns.

In example 25, the subject matter of any of examples 19-24 can optionally include the substrate is a printed circuit board.

In the foregoing specification, embodiments have been described with reference to specific exemplary embodiments thereof. It will be evident that various modifications may be made thereto without departing from the broader spirit and scope. The specification and drawings are, accordingly, to be regarded in an illustrative sense rather than a restrictive sense.

What is claimed is:

1. A device package, comprising:
   a package layer disposed on a substrate, wherein the package layer includes a mold layer surrounding a first plurality of solder balls and a die;
   a trench disposed in the mold layer to surround the die of the package layer; and
   a conductive layer disposed on a top surface of the die, wherein the conductive layer is disposed over the top surface of the die and in the trench of the package layer.

2. The device package of claim 1, wherein the trench has a specified distance between each of the edges of the die.

3. The device package of claim 1, wherein the trench has a specified width and a specified depth based on the conductive layer.

4. The device package of claim 1, further comprising:
   an interposer with a second plurality of solder balls disposed on the conductive layer and above the package layer; and
   an underfill layer disposed between a bottom surface of the interposer and a top surface of the package layer.

5. The device package of claim 4, further comprising:
   a memory with a third plurality of solder balls disposed on the interposer, wherein the third solder balls electrically couple the memory and the interposer; and
   a fourth plurality of solder balls disposed on a bottom surface of the substrate.

6. The device package of claim 5, wherein the substrate is disposed on a motherboard, and wherein the fourth plurality of solder balls electrically couple the substrate and the motherboard.

7. The device package of claim 1, further comprising a second memory with a fifth plurality of solder balls disposed on the conductive layer and above the package layer.

8. The device package of claim 1, wherein the conductive layer includes one or more different materials, and wherein the conductive layer is disposed on the top surface of the die with one or more different patterns.

9. The device package of claim 1, wherein the substrate is a printed circuit board.

10. A method of forming a device package, comprising:
    disposing a package layer on a substrate, wherein the package layer includes a mold layer surrounding a first plurality of solder balls and a die;
    disposing a trench in the mold layer to surround the die of the package layer; and
    disposing a conductive layer on a top surface of the die, wherein the conductive layer is disposed over the top surface of the die and in the trench of the package layer.

11. The method of claim 10, wherein the trench has a specified distance between each of the edges of the die.

12. The method of claim 10, wherein the trench has a specified width and a specified depth based on the conductive layer.

13. The method of claim 10, further comprising:
    disposing an interposer with a second plurality of solder balls on the conductive layer and above the package layer; and
    disposing an underfill layer between a bottom surface of the interposer and a top surface of the package layer.

14. The method of claim 13, further comprising:
    disposing a memory with a third plurality of solder balls on the interposer, wherein the third solder balls electrically couple the memory and the interposer; and
    disposing a fourth plurality of solder balls on a bottom surface of the substrate.

15. The method of claim 14, wherein the substrate is disposed on a motherboard, and wherein the fourth plurality of solder balls electrically couple the substrate and the motherboard.

16. The method of claim 10, further comprising disposing a second memory with a fifth plurality of solder balls on the conductive layer and above the package layer.

17. The method of claim 10, wherein the conductive layer includes one or more different materials, and wherein the conductive layer is disposed on the top surface of the die with one or more different patterns.

18. The method of claim 10, wherein the substrate is a printed circuit board.

19. A device package, comprising:
- a package layer disposed on a substrate, wherein the package layer includes a mold layer surrounding a first plurality of solder balls and a die;
- a trench disposed in the mold layer to surround the die of the package layer;
- a conductive layer disposed on a top surface of the die, wherein the conductive layer is disposed over the top surface of the die and in the trench of the package layer;
- an interposer with a second plurality of solder balls disposed on the conductive layer and above the package layer;
- an underfill layer disposed between a bottom surface of the interposer and a top surface of the package layer; and
- a memory with a third plurality of solder balls disposed on the interposer, wherein the third solder balls electrically couple the memory and the interposer, and wherein a fourth plurality of solder balls are disposed on a bottom surface of the substrate.

20. The device package of claim 19, wherein the trench has a specified distance between each of the edges of the die.

21. The device package of claim 19, wherein the trench has a specified width and a specified depth based on the conductive layer.

22. The device package of claim 19, wherein the substrate is disposed on a motherboard, and wherein the fourth plurality of solder balls electrically couple the substrate and the motherboard.

23. The device package of claim 19, wherein the conductive layer includes one or more different materials.

24. The device package of claim 19, wherein the conductive layer is disposed on the top surface of the die with one or more different patterns.

25. The device package of claim 19, wherein the substrate is a printed circuit board.

* * * * *